(12) United States Patent
Irino et al.

(10) Patent No.: US 6,984,267 B2
(45) Date of Patent: Jan. 10, 2006

(54) MANUFACTURE SYSTEM FOR SEMICONDUCTOR DEVICE WITH THIN GATE INSULATING FILM

(75) Inventors: Kiyoshi Irino, Kawasaki (JP); Ken-ichi Hikazutani, Kawasaki (JP); Tatsuya Kawamura, Kasugai (JP); Taro Sugizaki, Kawasaki (JP); Satoshi Ohkubo, Kawasaki (JP); Toshiro Nakanishi, Kawasaki (JP); Kanetake Takasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 122 days.

(21) Appl. No.: 10/235,824

(22) Filed: Sep. 6, 2002

(65) Prior Publication Data

US 2003/0022523 A1    Jan. 30, 2003

Related U.S. Application Data

(63) Continuation of application No. 09/342,057, filed on Jun. 29, 1999, now Pat. No. 6,468,926.

(51) Int. Cl.
*C23C 16/00* (2006.01)
*F27D 3/12* (2006.01)

(52) U.S. Cl. .................. 118/715; 118/724; 118/725; 432/241; 156/345.29; 156/345.33

(58) Field of Classification Search ................ 118/715, 118/724, 725; 432/241; 156/345.29, 345.33, 156/345.34
See application file for complete search history.

(56) References Cited

U.S. PATENT DOCUMENTS

| | | | | |
|---|---|---|---|---|
| 4,980,307 A | | 12/1990 | Ito et al. .................... 438/591 |
| 5,146,869 A | * | 9/1992 | Bohannon et al. .......... 118/724 |
| 5,164,012 A | * | 11/1992 | Hattori ....................... 118/725 |
| 5,217,560 A | * | 6/1993 | Kurono et al. ......... 156/345.43 |
| 5,279,670 A | * | 1/1994 | Watanabe et al. ........... 118/725 |
| 5,318,633 A | * | 6/1994 | Yamamoto et al. ......... 118/725 |
| 5,383,984 A | * | 1/1995 | Shimada et al. ....... 156/345.26 |
| 5,445,522 A | * | 8/1995 | Miyagi et al. .............. 432/156 |
| 5,484,484 A | * | 1/1996 | Yamaga et al. ............. 118/719 |

(Continued)

FOREIGN PATENT DOCUMENTS

JP            5-68865        *    3/1993

(Continued)

OTHER PUBLICATIONS

Korean Office Action dated May 30, 2005 (Korean Appln. 99-24800).

*Primary Examiner*—Jeffrie R. Lund
(74) *Attorney, Agent, or Firm*—Westerman, Hattori, Daniels & Adrian, LLP (57) ABSTRACT

A manufacture method for a semiconductor device includes the steps of: (a) transporting a silicon wafer into a reaction chamber having first and second gas introducing inlet ports; (b) introducing an oxidizing atmosphere via the first gas introducing inlet port and raising the temperature of the silicon wafer to an oxidation temperature; (c) introducing a wet oxidizing atmosphere to form a thermal oxide film on the surface of the silicon wafer; (d) purging gas in the reaction chamber by using inert gas to lower a residual water concentration to about 1000 ppm or lower; and (e) introducing an NO or $N_2O$ containing atmosphere into the reaction chamber via the second gas introducing inlet port while the silicon wafer is maintained above 700° C. and above the oxidation temperature, to introduce nitrogen into the thermal oxide film and form an oxynitride film. A thin oxynitride film can be manufactured with good mass productivity.

6 Claims, 7 Drawing Sheets

U.S. PATENT DOCUMENTS

| | | | | |
|---|---|---|---|---|
| 5,540,782 A * | 7/1996 | Miyagi et al. | | 118/724 |
| 5,567,152 A * | 10/1996 | Morimoto | | 432/241 |
| 5,571,329 A * | 11/1996 | Chan et al. | | 118/715 |
| 5,749,723 A * | 5/1998 | Okase | | 432/241 |
| 5,750,436 A * | 5/1998 | Yamaga et al. | | 438/558 |
| 5,753,046 A * | 5/1998 | Choi et al. | | 118/724 |
| 5,810,929 A * | 9/1998 | Yuuki | | 118/697 |
| 5,840,368 A * | 11/1998 | Ohmi | | 427/255.4 |
| 5,879,458 A * | 3/1999 | Roberson, Jr. et al. | | 118/715 |
| 5,880,040 A | 3/1999 | Sun et al. | | 438/769 |
| 5,885,870 A | 3/1999 | Maiti et al. | | 438/261 |
| 5,891,809 A | 4/1999 | Chau et al. | | 438/770 |
| 5,903,711 A * | 5/1999 | Okase | | 392/418 |
| 5,925,188 A * | 7/1999 | Oh | | 118/715 |
| 5,948,300 A * | 9/1999 | Gero et al. | | 219/390 |
| 5,968,593 A * | 10/1999 | Sakamoto et al. | | 427/248.1 |
| 5,990,517 A | 11/1999 | Irino | | 257/339 |
| 6,063,698 A | 5/2000 | Tseng et al. | | 438/585 |
| 6,090,210 A | 7/2000 | Ballance et al. | | 118/725 |
| 6,139,642 A * | 10/2000 | Shimahara et al. | | 118/724 |
| 6,159,298 A * | 12/2000 | Saito | | 118/715 |
| 6,191,388 B1 * | 2/2001 | Cleaver et al. | | 219/390 |
| 6,217,659 B1 * | 4/2001 | Botelho et al. | | 118/715 |
| 6,248,672 B1 * | 6/2001 | Takagi | | 438/758 |
| 6,270,581 B1 * | 8/2001 | Inokuchi et al. | | 118/696 |
| 6,302,963 B1 * | 10/2001 | Mitzan | | 118/715 |
| 6,331,211 B1 * | 12/2001 | Xu et al. | | 118/719 |
| 6,468,926 B1 * | 10/2002 | Irino et al. | | 438/773 |
| 6,589,349 B2 * | 7/2003 | Kashiwagi et al. | | 118/708 |
| 6,645,302 B2 * | 11/2003 | Udagawa | | 118/715 |
| 6,723,665 B2 * | 4/2004 | Tanabe et al. | | 438/795 |

FOREIGN PATENT DOCUMENTS

| | | |
|---|---|---|
| JP | 5-68866 | 3/1993 |
| JP | 6-302814 | 10/1994 |
| JP | 9-115904 | 5/1997 |
| JP | 9-148543 | 6/1997 |
| JP | 9-260363 | 10/1997 |
| JP | 10-32328 | 2/1998 |
| JP | 10-144617 | 5/1998 |
| JP | 10-163186 | 6/1998 |

* cited by examiner

MANUFACTURE SYSTEM FOR SEMICONDUCTOR DEVICE WITH THIN GATE INSULATING FILM

This is a continuation of application Ser. No. 09/342,057, filed Jun. 29, 1999, now U.S. Pat. No. 6,468,926.

This application is based on Japanese Patent Application HEI 10-185109, filed on Jun. 30, 1998, the entire contents of which are incorporated herein by reference.

BACKGROUND OF THE INVENTION a) Field of the Invention

The present invention relates to manufacture techniques for semiconductor devices, and more particularly a manufacture method and system for a semiconductor device capable of forming a thin oxynitride film on the surface of a silicon wafer.

b) Description of the Related Art

Demands for higher integration and higher operation speed of CMOS semiconductor devices are high. In order to meet such requests, it is necessary to make finer transistors constituting CMOS devices and improve a driving force. In the case of a p-channel MOS transistor, it is necessary to use a boron doped gate electrode for realizing a surface channel type and to make a thin gate insulating film.

As the gate insulating film is thinned, a phenomenon is likely to occur that boron ions doped into the gate electrode pass through the gate insulating film and reach the substrate channel region. It is known that in order to prevent this phenomenon, it is effective to use an oxynitride film as the gate insulating film.

Shallow trench isolation (STI) instead of LOCOS isolation has been proposed in order to manufacture high integration semiconductor devices. For the shallow trench isolation, a process of forming shallow grooves (trenches) in a wafer surface and then filling the insides of trenches with insulating material is performed before forming semiconductor elements. As a result, the active region surrounded by the isolation region has a convex cross sectional structure.

A thermal oxidation film to be formed on the convex area has stress so that the insulating film becomes hard to be grown, i.e., a thinning phenomenon occurs. If the thinning phenomenon occurs, it is difficult to make the thickness of a gate insulating film formed in the active region have reliably a constant value. In order to prevent the thinning phenomenon, it is known that wet oxidation is effective.

As compared to dry oxidation, wet oxidation provides a high oxidation speed so that it can effectively form an oxide film at a lower temperature. In order to form an oxynitride film through wet oxidation, base oxidation is first performed to form a thin oxide film, and then nitrogen is introduced into this oxide film.

For example, a wet oxide film is formed on a plurality of wafers at the same time in a vertical batch diffusion furnace, and thereafter nitrogen is introduced into the oxide film in the unit of wafer, i.e. wafer by wafer, by using a single wafer annealing system.

As described above, it is effective to use an oxynitride film as the gate insulating film in order to manufacture micro-channel MOS transistors having a high driving force. However, a manufacture process of forming a gate insulating film of a thin oxynitride film is complicate and the manufacture throughput lowers. Therefore, this process is not suitable for mass production.

It is desired to use NO or $N_2O$ as nitrogen containing gas when nitrogen is introduced into an oxide film. However, presently available systems are not capable of using such gas.

SUMMARY OF THE INVENTION

It is an object of the present invention to provide a manufacture method or system for a semiconductor device capable of forming a thin oxynitride film with good mass productivity.

It is another object of the present invention to provide a manufacture method or system for a semiconductor device capable of introducing nitrogen by using NO or $N_2O$.

According to one aspect of the present invention, there is provided a manufacture method for a semiconductor device comprising the steps of: (a) transporting a silicon wafer into a reaction chamber having at least first and second gas introducing inlet ports and sealing the reaction chamber with an O-ring; (b) after said step (a), introducing an oxidizing atmosphere into the reaction chamber via the first gas introducing inlet port and raising a temperature of the silicon wafer to an oxidation temperature while the reaction chamber is maintained in the oxidizing atmosphere; (c) after said step (b), introducing a wet oxidizing atmosphere into the reaction chamber via the first gas introducing inlet port while the oxidation temperature is retained, to form a thermal oxide film on a surface of the silicon wafer; (d) after said step (c), purging gas in the reaction chamber by using inert gas to lower a residual water concentration to about 1000 ppm or lower; and (e) after said step (d), introducing an NO or $N_2O$ containing atmosphere into the reaction chamber via the second gas introducing inlet port while the silicon wafer is maintained at an annealing temperature which is at 700° C. or higher and higher than the oxidation temperature, to introduce nitrogen into the thermal oxide film and to form an oxynitride film.

According to another aspect of the present invention, there is provided a manufacture system for a semiconductor device comprising: a reaction chamber; a first gas introducing path communicating with an internal space of said reaction chamber; a second gas introducing path communicating with an internal space of said reaction chamber at a position different from said first gas introducing path; and a gas flow check valve provided to each of said first and second gas introducing paths.

It is desired to perform wet oxidation and nitrogen introduction in the same chamber in order to form a thin oxynitride film with good mass productivity. However, during the process of wet oxidation and nitrogen introduction in the same chamber, the nitrogen containing gas may be mixed with water content or $O_2$.

If NO or $N_2O$ is used as the nitrogen containing gas, nitric acid may be formed with a higher possibility when the gas is mixed with water content or $O_2$. If the nitric acid formed in the chamber flows back and diffuses into a gas pipe, the metal of the gas pipe may be corroded.

It is possible to prevent mixture of a wet oxidizing atmosphere and a nitrogen introducing atmosphere and form a good oxynitride film, by separating processes and sufficiently purging gas in a reaction chamber by using inert gas at the intermediate processes.

As above, a thin oxynitride film of a high quality can be manufactured efficiently.

DETAILED DESCRIPTION OF THE PREFERRED EMBODIMENTS

The present inventors propose that after wet oxidation is performed in a reaction chamber, nitrogen is introduced into a wet oxide film by using NO or $N_2O$ in the same chamber. Embodiments of the invention will be described with reference to the accompanying drawings.

Figure 1A:
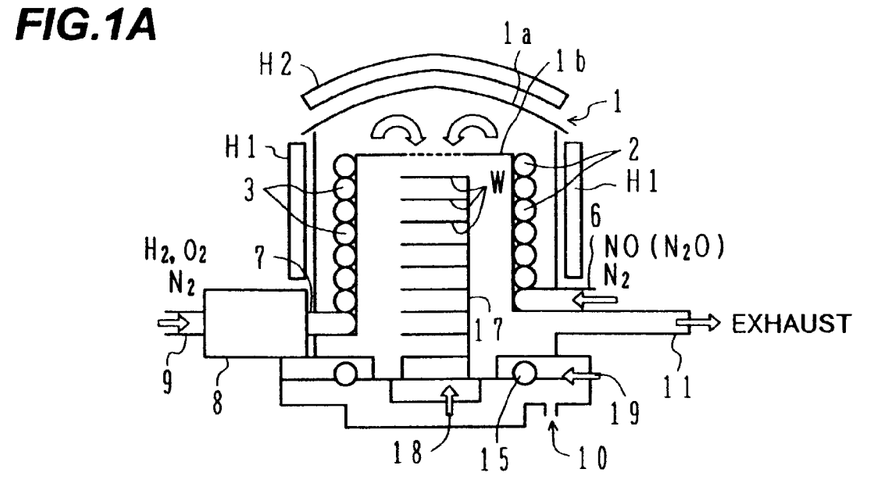
FIGS. 1A and 1B are schematic cross sectional views of a semiconductor manufacture system according to an embodiment of the invention.

FIG. 1A is a schematic diagram of a semiconductor manufacture system according to an embodiment of the invention. Although this system has an air tight structure, the main function of the system in this embodiment is to perform oxidation and introduce nitrogen at the atmospheric pressure (the pressure of the environment atmosphere). A reaction chamber 1 has a double quartz tube structure. An outer tube 1a defines a space which can be evacuated. An inner tube 1b disposed in the outer tube 1a has a semi-open structure having a section formed for introducing gas therethrough at an upper position thereof.

A space in the inner tube 1b communicates with a drain port at a lower position of the tube 1b. A nitrogen containing gas introducing pipe 2 and a wet oxidizing atmosphere introducing pipe 3 are alternately and spirally disposed around the outer circumferential (side) wall of the inner tube 1b in an intermediate space between the outer and inner tubes 1a and 1b. The nitrogen containing gas introducing pipe 2 is used for introducing NO or $N_2O$ and the wet oxidizing atmosphere introducing pipe 3 is used for introducing a wet oxidizing atmosphere.

The nitrogen containing gas introducing pipe 2 is connected to a nitrogen containing gas inlet port 6 which is air tightly coupled to the outer tube 1a. The wet oxidizing atmosphere introducing pipe 3 is connected to a wet oxidizing atmosphere inlet port 7 which is air tightly coupled to the outer tube 1a. The wet oxidizing atmosphere inlet port 7 is connected to an external combustion tube 8 for generating water content by oxyhydrogen flame. The external combustion tube 8 is connected to a pipe 9 from which $H_2$, $O_2$, or $N_2$ can be supplied.

Heaters H1 and H2 are disposed at the outside of the reaction chamber 1 having the double tube structure. The heater H1 surrounds the outer side wall of the reaction chamber and the heater H2 is disposed above the upper wall of the reaction chamber 1.

Instead of the double tube structure, a single tube structure may be used. In this case, the outer tube 1a shown in FIG. 1A is omitted, and only the inner tube 1b is used as a single tube having an air tight structure. In this case, two gas introducing pipes are alternately and spirally disposed around the outer wall of the single tube reaction chamber and inserted into the reaction chamber through its top wall. Alternatively, the inner tube 1b shown in FIG. 1A may be omitted, and the outer tube 1a is used as a single tube reaction chamber. In this case, two gas introducing pipes may be extended from a lower position to a higher position in the reaction chamber.

The bottom of the reaction chamber 1 is coupled to a quartz cap 10 with an O-ring 15. A wafer carrier can be placed on this quartz cap 10 which has the structure capable of coupling with the reaction chamber 1 and being dismounted from the reaction chamber 1. A plurality of silicon wafers (e.g., 100 wafers) are placed on the wafer carrier 17 coupled to the quartz cap 10.

In order to purge the gas in the reaction chamber 1, a desired number of $N_2$ pipes 18 and 19 are disposed at predetermined positions so that inert gas introduced from the pipes 2 and 3 and exhausted from the drain port 11 is not left in the reaction chamber 1.

Figure 1B:
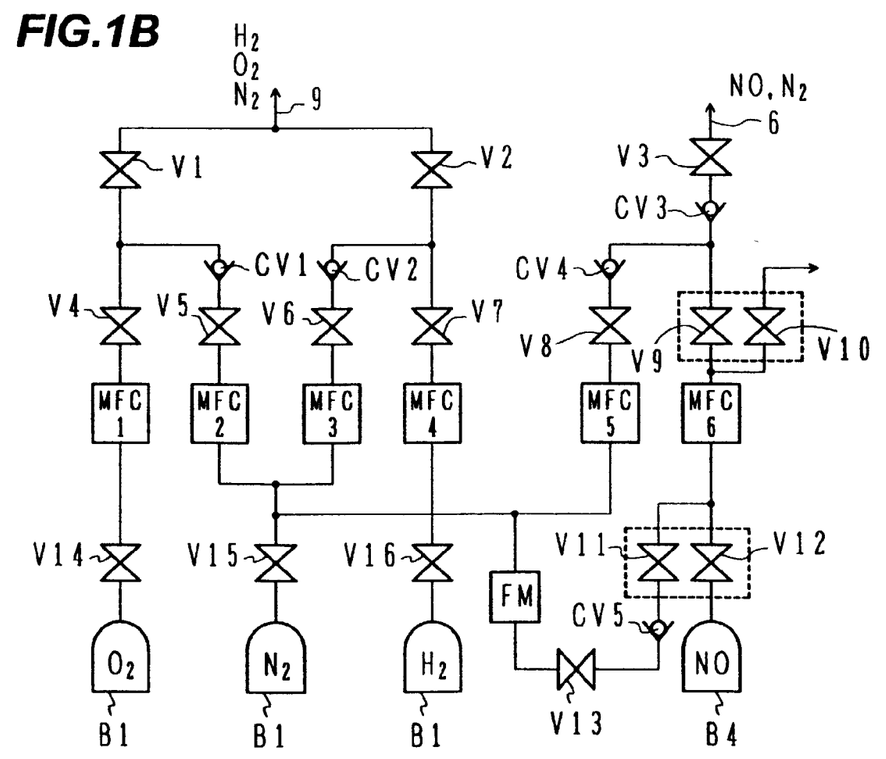

In order to supply desired gas into the gas introducing pipes 9 and 6, gas piping as shown in FIG. 1B may be provided.

As shown in FIG. 1B, the pipe 9 connected to the external combustion tube 8 is branched to two valves V1 and V2. The valve V1 is connected to an $O_2$ source B1 via a valve V4, a mass flow controller MFC1 and a valve V14, and also connected to an $N_2$ source B2 via a gas flow check valve CV1, a valve V5, a mass flow controller MFC2 and a valve V15.

The valve V2 is connected to an $H_2$ source B3 via a valve V7, a mass flow controller MFC4 and a valve V16, and also connected to the $N_2$ source B2 via a gas flow check valve CV2, a valve V6, a mass flow controller MFC3 and the valve V15.

With such a gas pipe connection, the pipe 9 can be supplied with any mixture gas selected from $H_2$, $O_2$ and $N_2$. If $H_2$ is supplied from the $H_2$ source B3 and $O_2$ is supplied from the $O_2$ source B1, oxyhydrogen flame can be formed in the external combustion tube 8 and an atmosphere for pyro-oxidation can be formed. If necessary, a mixture of $H_2$ and $O_2$ can be diluted with $N_2$.

During the period after the pyro-oxidation, $N_2$ can be supplied from the $N_2$ source B2 after the valves V7 and V4 for the $H_2$ and $O_2$ pipes are closed. This $N_2$ flow path is provided with the gas flow check valves CV1 and CV2 so that gas is prevented from returning back from the reaction chamber 1.

As shown in FIG. 1B, the nitrogen containing gas introducing pipe 6 is connected through a valve V3 to a gas flow check valve CV3. The gas flow check valve CV3 is connected to an NO source B4 via a valve V9, a mass flow controller MFC6 and a valve V12, and also connected to the $N_2$ source B2 via a gas flow check valve CV4, a valve V8, a mass flow controller MFC5 and the valve V15. Instead of NO, an $N_2O$ gas source B4 may be used.

The $N_2$ source B2 is also connected to the mass flow controller MFC6 via the valve V15, a flow meter FM, a valve V13, a gas flow check valve CV5 and a valve V11.

An outlet port of the mass flow controller MFC6 connected to the valve V9 is guided via a valve V10 to the external space. The valves V9 and V10 operate in unison so that when one is closed, the other is opened. The valves V11 and V12 are also controlled to operate in unison.

While NO is not supplied to the reaction chamber 1, $N_2$ is supplied from the $N_2$ source B2. This $N_2$ flow path is provided with the gas flow check valves CV4, CV5 and CV3 so that the atmosphere in the reaction chamber 1 is prevented from returning back. With this pipe connection, NO gas diluted with $N_2$ or $N_2$ gas is supplied to the pipe 6.

Other optional gas sources and corresponding pipes may be connected. For example, an HCl source and its pipes may be provided for hydrochloric acid oxidation. It is obvious for those skilled in the art that various gas pipes may be connected according to the objective of the system.

Figure 2:
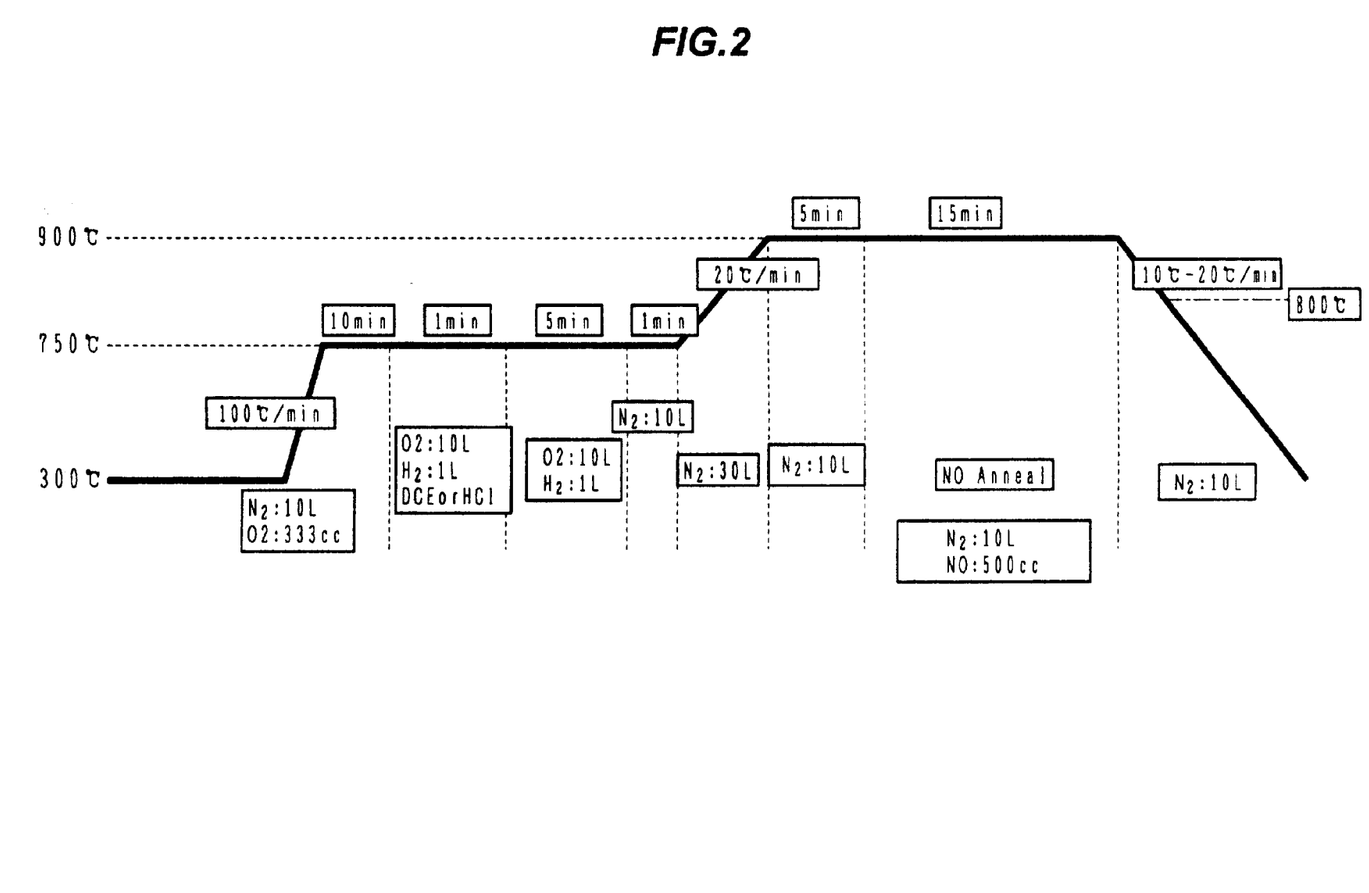
FIG. 2 is a flow chart illustrating an oxynitride film forming process according to an embodiment of the invention.

FIG. 2 is a flow chart illustrating wet oxidation and nitrogen introduction, both at atmospheric pressure, by using the reaction chamber shown in FIGS. 1A and 1B. The abscissa represents time and the ordinate represents temperature in the reaction chamber 1. The temperature is controlled by regulating the heaters H1 and H2 mounted outside of the reaction chamber 1.

After a number of silicon wafers W are accommodated in the reaction chamber 1, $N_2$ is supplied at 10 lit/min and $O_2$ is supplied at 333 cc/min and the temperature in the reaction chamber 1 is raised to 300° C. After the state at 300° C. is maintained for a predetermined time and while a dry oxidizing atmosphere of $N_2+O_2$ is maintained, the temperature in the reaction chamber 1 is raised to 750° C. at a rate of 100° C./min.

After the state at 750° C. in the dry oxidizing atmosphere is maintained for 10 minutes, the atmosphere is changed to an atmosphere of $O_2$ at 10 lit/min and $H_2$ at 1 lit/min with dichloroethylene (DCE) or HCl being added for about one minute, for gettering of metallic contamination. If there is no possibility of metallic contamination, this step may be omitted. After one minute lapse, $H_2$ is burned in the external combustion tube 8. Oxyhydrogen flame in the external combustion tube 8 forms water content. In this manner, a wet oxidizing atmosphere containing $H_2O$ and $O_2$ is supplied to the reaction chamber 1. The wet oxidizing atmosphere contains $H_2O$ preferably in a range from 1% to 100%, and more preferably in a range from 5% to 30%.

The oxidation temperature may be set in a range from 700° C. to 900° C. for precisely controlling the thickness of the oxide film and for suppressing the change in channel profile.

After wet oxidation is performed in the wet oxidizing atmosphere at 750° for five minutes, the atmosphere gas is changed to nitrogen. For example, $N_2$ is supplied at 10 lit/min and a state at 750° C. is maintained for one minute. Thereafter, the $N_2$ flow is increased to 30 lit/min and the temperature is raised to 900° C. at a rate of 20° C./min. After the temperature reaches 900° C., the $N_2$ flow is lowered at 10 lit/min and this state is maintained for five minutes.

Thereafter, while $N_2$ is supplied to the wet oxidizing atmosphere introducing inlet port 7, a nitrogen containing gas atmosphere is supplied to the nitrogen containing gas introducing inlet port 6, this atmosphere being made of NO (flow of 500 cc/min) diluted with $N_2$ (flow of 10 lit/min). In this state, annealing is performed at 900° C. for 15 minutes. This annealing is a process of introducing NO into a wet oxide film. After the NO annealing process is completed, the gas supplied to the nitrogen containing gas introducing inlet port 6 is changed to $N_2$ at 10 lit/min and the temperature in the reaction chamber 1 is lowered at a speed of 10° C./min to 20° C./min. With a nitrogen containing gas process in non-oxidizing atmosphere at a relatively low temperature of 1000° C. or lower, in particular in a range from 800° C. to 950° C., nitrogen is preferentially segregated at an interface between the wet oxide film and the silicon wafer. When the temperature is too high, the channel profile will change.

With the above processes, first a wet oxide film is formed on the surface of a silicon wafer W, and then the gas in the reaction chamber is purged by using $N_2$. Thereafter, the temperature is raised to an annealing temperature to anneal with NO gas and introduce nitrogen into the wet oxide film.

In this embodiment, a process of introducing nitrogen into the wet oxide film is not performed immediately after wet oxidation is performed in the reaction chamber 1, but the gas in the reaction chamber is purged by using $N_2$ gas. The effects of this $N_2$ gas purge were checked by the following method.

The $N_2$ gas purge is a process of completely removing the wet oxidizing atmosphere from the reaction chamber. Particularly, this process prevents water content in the wet oxidizing atmosphere from forming nitric acid during the later process of introducing nitrogen by using NO. The concentration of residual water content in the reaction chamber 1 was measured.

Figure 3:
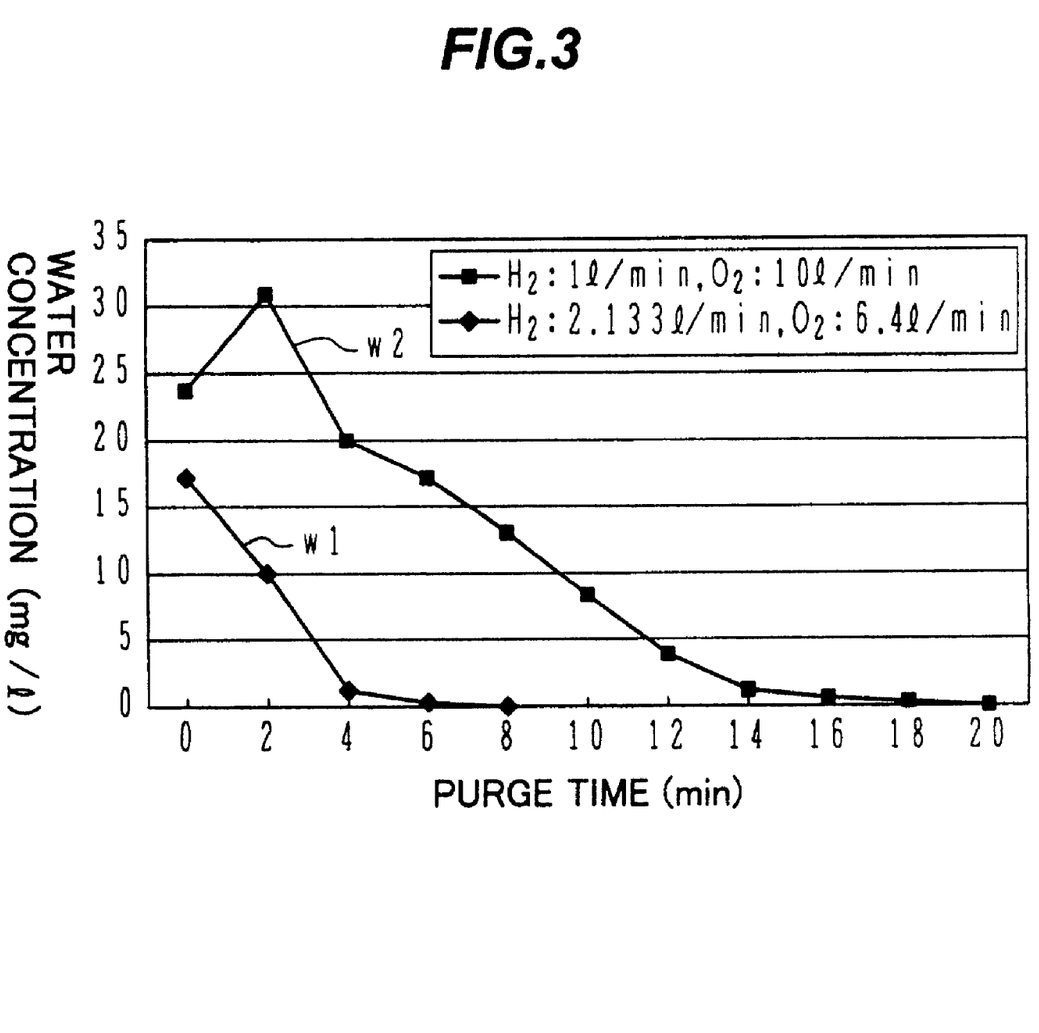
FIG. 3 is a graph showing a change in a water concentration during $N_2$ purging.

FIG. 3 is a graph showing the measured result of water concentration in the reaction chamber 1 relative to a purge time. The water concentration was measured through analysis of gas on the drain side.

Two conditions were adopted for the wet oxidation. One is an $H_2$ flow of 1 lit/min+an $O_2$ flow of 10 lit/min, the other is an $H_2$ flow of 2.133 lit/min+an $O_2$ flow of 6.4 lit/min with an increased $H_2O$ amount. Thereafter, purge was performed by changing the gas to $N_2$. A curve w1 in FIG. 3 shows a change in the water concentration in the $N_2$ purge following a wet oxidation under the first conditions, and a curve w2 shows a change in the water concentration in the $N_2$ purge following a wet oxidation under the second conditions.

In the case of the curve w1, the water concentration becomes about 1000 ppm or smaller by the purge of about 6 minutes, following the wet oxidation and approximately 0 ppm by the purge of about 8 minutes. In the case of the curve w2, the water concentration lowers relatively slowly and reaches about 1000 ppm by the purge of about 16 minutes.

It can be assumed from these results that the purge time is preferably about 6 minutes or longer under the first conditions of a relatively low water concentration in the wet oxidation atmosphere, and that the purge time is preferably about 16 minutes or longer under the second conditions of a very high water concentration in the wet oxidation atmosphere.

In the process of shown in FIG. 2, the wet oxidation is performed under the first conditions and the $N_2$ purge is performed for a period longer than 8 minutes. Therefore, it can be expected that the residual water concentration should reliably be lower than about 1000 ppm.

A change in wafer contamination to be caused by wet oxidation, $N_2$ purge and NO annealing was checked. Wafers were placed in the reaction chamber without intentionally processing the inside of the reaction chamber, and wet oxidation under the first conditions, $N_2$ purge and NO annealing were repeated ten times. Metal species Fe and Ca on wafers were then measured. The purge time was set to 15 minutes and 5 minutes. The results are shown in the following Table.

| Metal species | Purge of water content for 15 minutes | Purge of water content for 5 minutes |
| --- | --- | --- |
| Fe | $5.8 \times 10^{10}$ atoms/cm$^2$ | $2.1 \times 10^{11}$ atoms/cm$^2$ |
| Ca | $4.2 \times 10^{10}$ atoms/cm$^2$ | $3.5 \times 10^{10}$ atoms/cm$^2$ |

As seen from this Table, Fe reduces considerably when the purge is performed for 15 minutes after the wet oxidation more than when it is performed for 5 minutes. Namely, even if the $N_2$ purge is performed for a time sufficient for lowering the water concentration to about 1000 ppm or lower, it can be expected that Fe contamination does not occur. On the contrary, Fe concentration is expected to lower. It can be understood that Ca takes almost a constant value independently from the purge time.

It is therefore preferable to perform the $N_2$ gas purge after the wet oxidation until the residual water concentration becomes sufficiently low, preferably about 1000 ppm or lower.

Instead of the $N_2$ purge, other inert gas such as Ar may be used for the purge. In this specification, gases including $N_2$, Ar and the like are called inert gas.

FIGS. 4A to 4D are schematic cross sectional views illustrating a semiconductor manufacture method according to an embodiment of the invention.

Figure 4A:
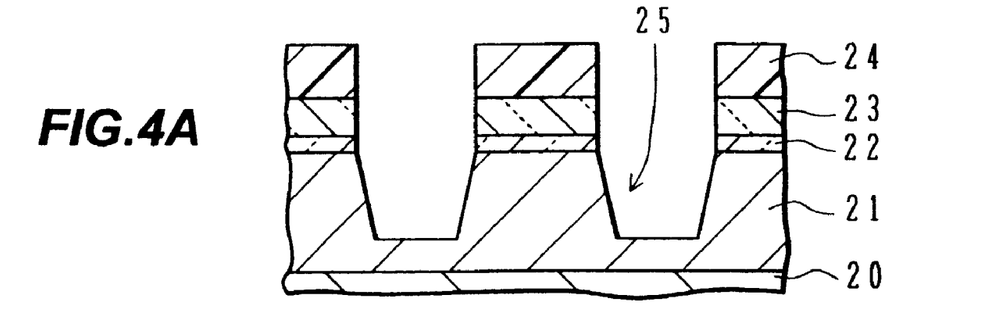
FIGS. 4A to 4D are schematic cross sectional views illustrating a semiconductor manufacture method according to an embodiment of the invention.

As shown in FIG. 4A, on the surface of a p-type silicon wafer 20 having an n-type well 21, a thin buffer oxide film 22 is formed through thermal oxidation and thereafter an SiN film 23 is formed on the thin buffer oxide film 22 by CVD. A resist pattern 24 is formed on the SiN film 23, openings in the resist pattern 24 defining isolation regions.

By using the resist pattern 24 as an etching mask, the SiN film 23, buffer oxide film 22 and silicon 21 are anisotropically etched to form isolation trenches 25. The resist pattern 24 is thereafter removed.

A thermal oxide film is formed through liner oxidation on the Si surface exposed in the trench 25. Thereafter, a silicon oxide film is deposited on the wafer surface by CVD to form an embedding oxide film which embeds the trench 25. The wafer surface is thereafter planarized by chemical mechanical polishing (CMP) and the exposed SiN film 23 is removed. Then, the buffer oxide film 22 is removed and the exposed Si surface is sacrificially oxidized. This sacrificial oxide film is removed to expose a clean Si surface. Thereafter, a gate oxynitride film is formed by using the manufacture system shown in FIGS. 1A and 1B and the process described with FIG. 2.

Figure 4B:
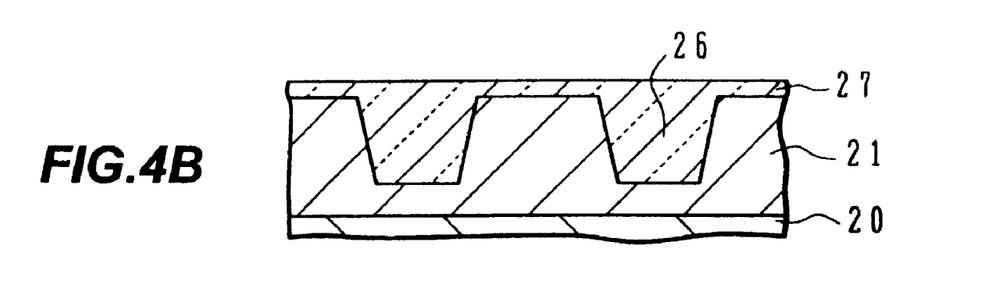

FIG. 4B is a schematic cross sectional view of the wafer having a shallow trench isolation (STI) oxide film 26 and a gate insulating oxynitride film 27 formed on the Si surface. By performing the above-described wet oxidation, $N_2$ purge and NO annealing, the silicon oxynitride film 27 having a uniform and good quality can be formed on the active region surface. Thereafter, MOS transistors are formed by general processes. Although a p-channel MOS transistor is shown, an n-channel MOS transistor is also formed in the other region of the wafer. For manufacture processes of such a CMOS circuit, refer for example to "98' Latest Semiconductor Process Techniques, System LSI Manufacture Processes in 300 mm/0.18 $\mu$m Era", by Kazuyoshi FUJITA, pp. 37–46, which is incorporated herein by reference.

Figure 4C:
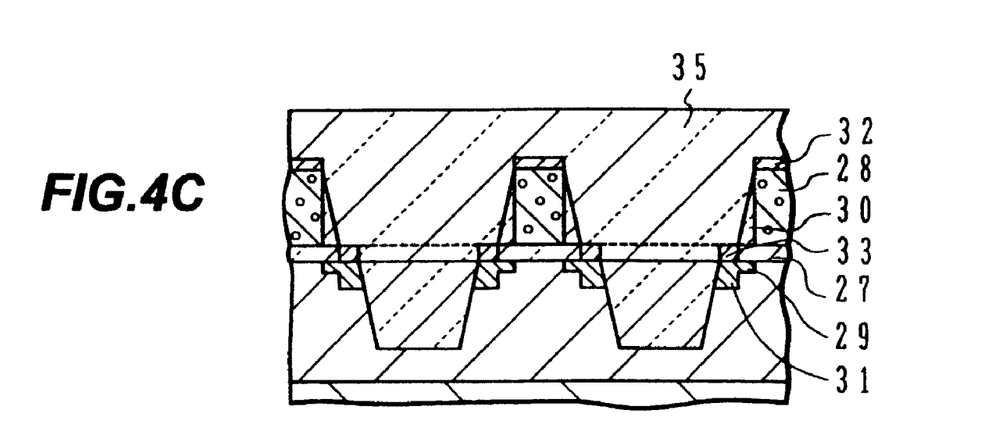

As shown in FIG. 4C, a polysilicon layer is deposited on the gate insulating film 27 by CVD, and a gate electrode 28 is formed through anisotropic etching using a resist pattern.

After the gate electrode 28 is patterned, boron ions are lightly implanted to form an LDD region 29. In this case, boron ions are implanted also into the gate electrode 28. This ion implantation process is performed for the p-channel region by using a resist mask. Another ion implantation process is performed for the n-channel region.

Thereafter, an oxide film is formed by CVD on the wafer surface, and anisotropic etching is performed to leave a side wall oxide spacer 30 only on the side wall of the gate electrode 28. By using the side wall oxide spacer 30 and gate electrode 28 as a mask, boron ions are implanted to form source/drain regions 31 of a high impurity concentration. Also in this case, this ion implantation process is performed only for the p-channel region, and another ion implantation process is performed for the n-channel region.

After an oxide film on the gate polysilicon and source/drain regions, if any, is removed, a Co film is formed over the wafer surface and a heat treatment is performed to conduct a salicide process of forming a Co silicide film on the region where silicon is exposed. In this manner, a Co silicide film 32 is formed on the upper surface of the gate electrode 28 and a Co silicide film 33 is formed on the exposed surfaces of the source/drain regions 31. Thereafter, an interlayer insulating film 35 is deposited by CVD or the like and a CMP process is performed to planarize the surface thereof.

Figure 4D:
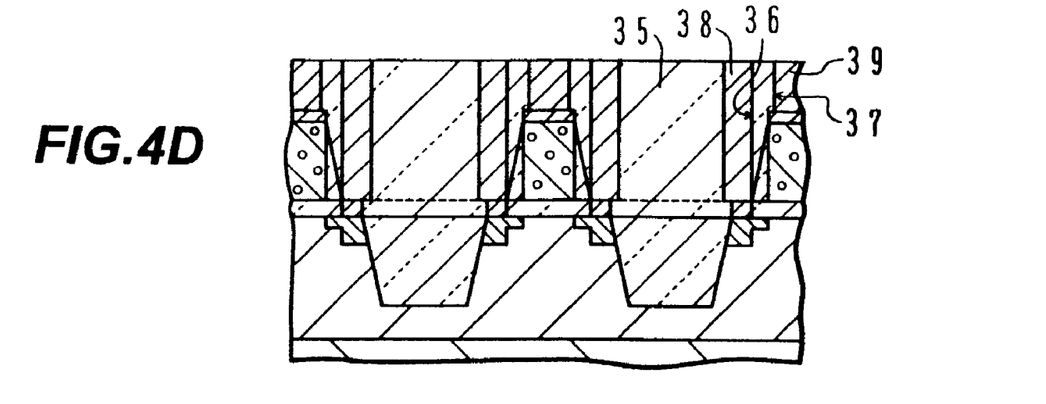

As shown in FIG. 4D, a resist pattern is formed on the interlayer insulating film 35 and contact holes 37 and 37 are formed through the interlayer insulating film 35. After the contact holes are formed, electrode metal is deposited to fill the insides of the contact holes with the electrode metal. A CMP process is then performed to leave electrode plugs 38 and 39 in the contact holes. Sintering is then performed to improve the characteristics of the electrode plugs.

Figure 4E:
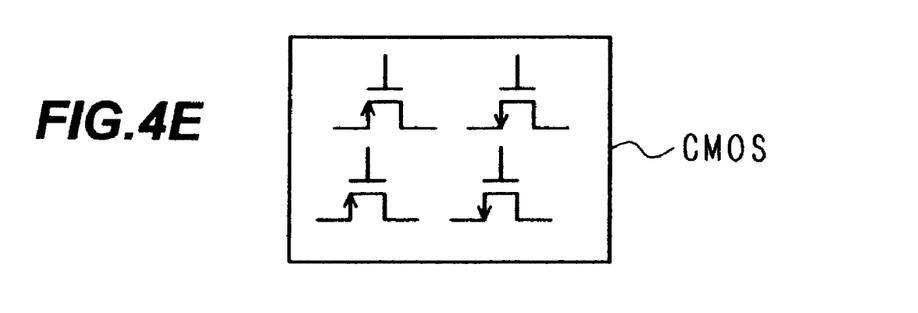
FIG. 4E is a schematic equivalent circuit diagram.

With the above processes, a p-channel MOS transistor with electrodes can be formed. An n-channel MOS transistor is formed in the other region of the wafer to thus form CMOS LSI such as shown in FIG. 4E.

Figure 5A:
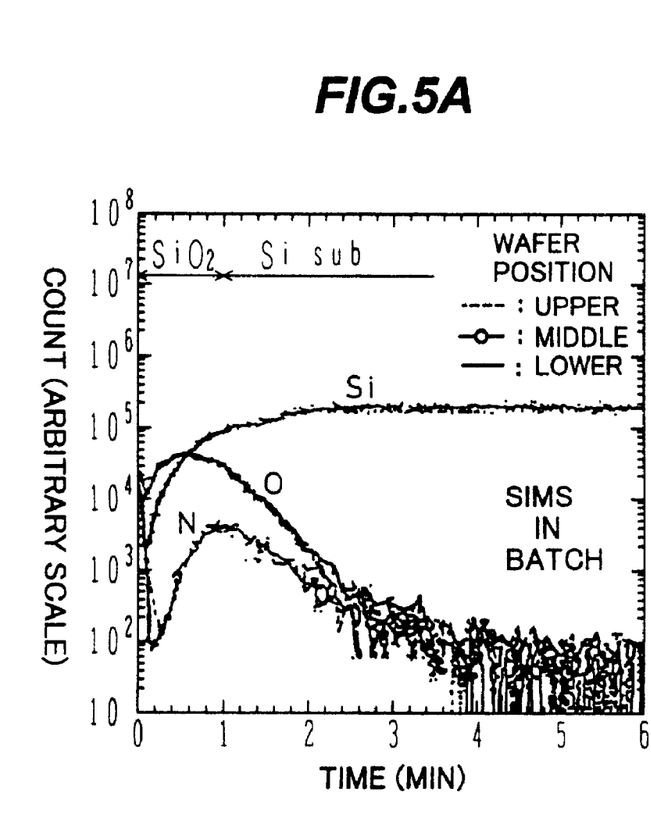
FIGS. 5A and 5B are graphs showing the measurement results of uniformity of oxynitride films formed on a number of wafers by using the manufacture system shown in FIGS. 1A and 1B.
Figure 5B:
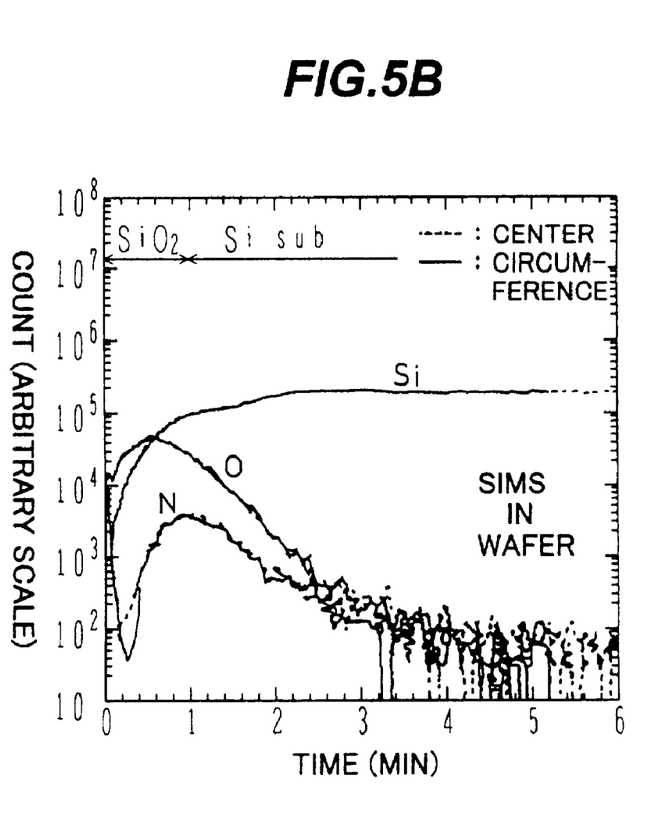

FIGS. 5A and 5B are graphs showing the measurement results of distributions of Si, O and N in a batch of a plurality of wafers and in a single wafer, each wafer being formed with an oxynitride film by the manufacture system shown in FIGS. 1A and 1B and the process described with FIG. 2. The measurement was made by using SIMS.

FIG. 5A shows the SIMS measurement results of a batch of a plurality of wafers. The abscissa represents etching time starting from the wafer surface, and the ordinate represents a count of detection signals for each element. The measured distribution of Si, O and N shows that the distribution is uniform in each of wafers of the batch. It may further be noted that N distribution shows a sharp peak at the interface between the silicon oxide film and the silicon wafer. The oxide film with graded N concentration as described above is also called an oxynitride film in this specification.

FIG. 5B shows the SIMS measurement results of a single wafer in its in-plane. Similar to FIG. 5A, the abscissa represents etching time and the ordinate represents a count of detection signals. The distribution of N clearly shows a peak at the $SiO_2$/Si interface. The measured distribution of Si, O and N converges into a very narrow area, which shows that an oxynitride film of a uniform quality is formed at generally the same thickness all over the in-plane positions of the wafer.

It is known that an oxide film formed by wet oxidation may have an insufficient density. The density of such oxide film can be improved by an ozone process.

Figure 6A:
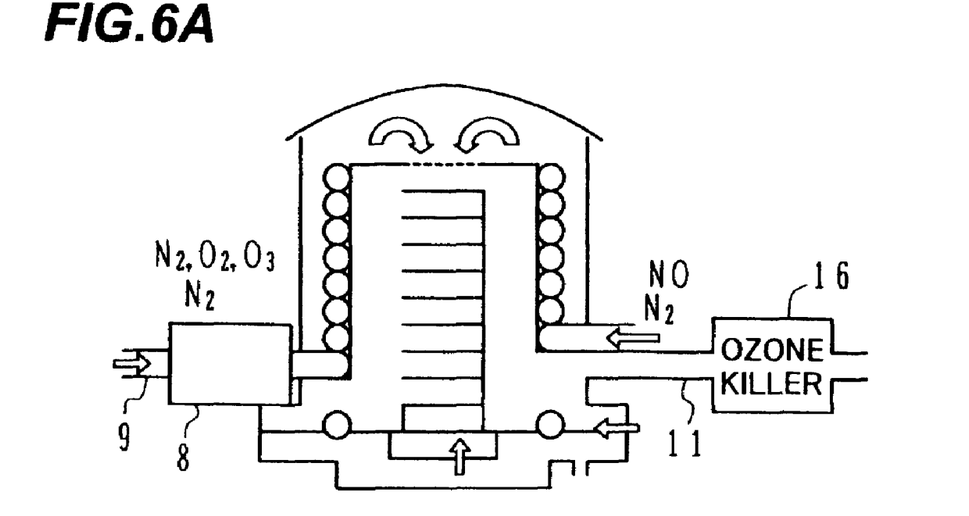
FIGS. 6A and 6B are a cross sectional view of a semiconductor device manufacture system and a flow chart illustrating an oxynitrization process, according to another embodiment of the invention.
Figure 6B:
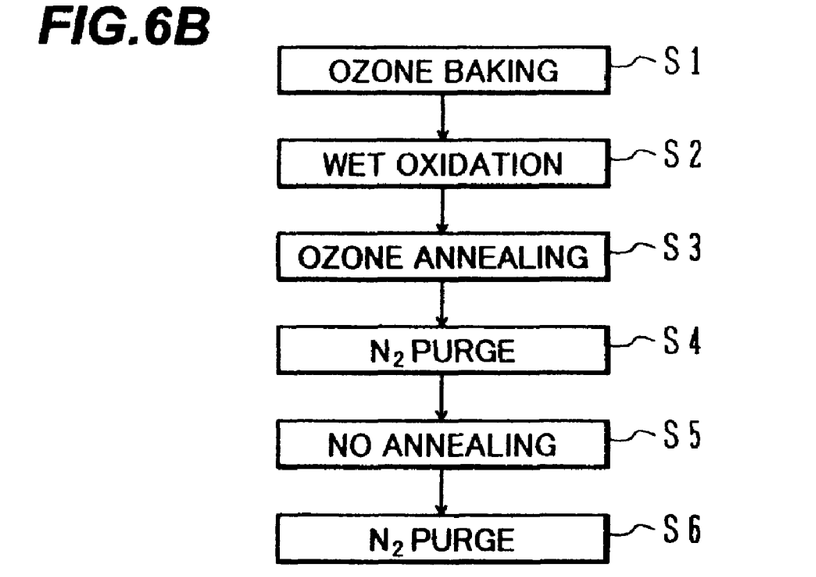

FIG. 6A shows a manufacture system capable of performing an ozone process and FIG. 6B is a flow chart illustrating an oxynitrization process adopting the ozone process.

Referring to FIG. 6A, a pipe 9 connected to an external combustion tube 8 can be supplied with $O_3$ (including $O_3$ containing $O_2$) as well as $H_2$, $O_2$, and $N_2$. When $O_3$ is supplied, it is preferable to lower the temperature in the external combustion tube 8 in order to suppress decomposition of $O_3$. An ozone killer 16 is connected to a drain pipe 11. Even if ozone is contained in drain gas, this ozone can be vanished by the ozone killer 16.

FIG. 6B is a flow chart illustrating an oxynitrization process including the ozone process. Step S1 is an ozone baking process. This ozone baking process may be performed at the 300° C. preheating process in the flow chart shown in FIG. 2. This ozone baking process is effective for removing organic substances on a wafer surface or the like.

Step S2 is a wet oxidation process. The wet oxidation process may be performed in a wet oxidizing atmosphere at 750° C. shown in the flow chart of FIG. 2.

Step S3 is an ozone annealing process following the wet oxidation process. The ozone annealing process may be performed by replacing the wet oxidizing atmosphere by an ozone containing oxidizing atmosphere, and at the same temperature as the wet oxidation temperature. If ozone contacts a high temperature wall, it may more possibly vanish. Therefore, ozone may be supplied to the reaction chamber via another pipe, without passing it through the external combustion tube 8.

Step S4 is an $N_2$ purging process following the ozone annealing process. The $N_2$ purging process is similar to the $N_2$ purging process in the flow chart of FIG. 2. At the wet oxidation temperature, the atmosphere is replaced by $N_2$ and the temperature is gradually raised to the annealing temperature while $N_2$ continues to be supplied to the reaction chamber.

Step S5 is an NO annealing process at the annealing temperature. This annealing process can be performed under the same conditions as the NO annealing process in the flow chart of FIG. 2. Thereafter, $N_2$ is supplied to the reaction chamber to continue the $N_2$ purging while the temperature is lowered.

As above, with a combination of the wet oxidation and ozone annealing, an oxide film which is dense, having a high density, and has less impurities can be formed. The following NO annealing forms an oxynitride film of a high quality.

The present invention has been described in connection with the preferred embodiments. The invention is not limited only to the above embodiments. It will be apparent to those skilled in the art that various modifications, improvements, combinations, and the like can be made.

What is claimed is:

1. A manufacture system for a semiconductor device comprising:
   a reaction chamber of a double-tube structure having an outer tube capable of being evacuated and an inner tube of a semi-open structure so that the inner tube communicates with the outer tube;
   a first gas introducing path communicating with an internal space of said reaction chamber;
   a second gas introducing path communicating with the internal space of said reaction chamber at a position different from said first gas introducing path;
   said first and second gas introducing paths being spirals disposed around the inner tube in an intermediate space between the outer and inner tubes of the double-tube structure; and
   a gas flow check valve provided to each of said first and second gas introducing paths.

2. A manufacture system according to claim 1, further comprising a heater disposed outside of the double-tube structure.

3. A manufacture system according to claim 1, wherein said first gas introducing path comprises:
   an external combustion tube disposed outside of the double-tube structure;
   a first subsidiary pipe connected to the external combustion tube and being capable of flowing therethrough $N_2$ and $O_2$; and
   a second subsidiary pipe connected to the external combustion tube and being capable of flowing therethrough $N_2$ and $H_2$.

4. A manufacture system according to claim 3, wherein said second gas introducing path has a gas pipe for selectively flowing therethrough either a gas containing NO or $N_2O$, or an inert gas.

5. A manufacture system according to claim 4, wherein said first and second gas introducing paths comprise alternately and spirally disposed pipes.

6. A manufacture system according to claim 1, wherein said first and second gas introducing paths comprise alternately and spirally disposed pipes.

* * * * *

UNITED STATES PATENT AND TRADEMARK OFFICE
CERTIFICATE OF CORRECTION

PATENT NO. : 6,984,267 B2 Page 1 of 1
APPLICATION NO. : 10/235824
DATED : January 10, 2006
INVENTOR(S) : Kiyoshi Irino et al.

It is certified that error appears in the above-identified patent and that said Letters Patent is hereby corrected as shown below:

Title Page:
Col. 1;
Please add Item (30) Foreign Application Priority Data

June 30, 1998   (JP) ............................................10-185109

Signed and Sealed this

Twenty-second Day of August, 2006

JON W. DUDAS
*Director of the United States Patent and Trademark Office*